United States Patent [19]

Samad

[11] Patent Number: 4,996,689
[45] Date of Patent: Feb. 26, 1991

[54] METHOD OF GENERATING TESTS FOR A COMBINATIONAL LOGIC CIRCUIT

[75] Inventor: Muhammad A. Samad, Sunnyvale, Calif.

[73] Assignee: VLSI Technology, Inc., San Jose, Calif.

[21] Appl. No.: 305,449

[22] Filed: Feb. 1, 1989

[51] Int. Cl.⁵ ............................................. G06F 11/00
[52] U.S. Cl. .................................. 371/22.2; 371/22.1; 371/27
[58] Field of Search ..................... 371/22.2, 22.1, 27, 371/25.1, 15.1, 22.6, 22.5; 324/73 R, 73 AT

[56] References Cited

U.S. PATENT DOCUMENTS

| | | | |
|---|---|---|---|
| 3,958,110 | 5/1976 | Hong | 371/22.2 |
| 4,204,633 | 5/1980 | Goel | 371/23 X |
| 4,499,579 | 2/1985 | Still | 371/22.2 |
| 4,672,610 | 6/1987 | Salick | 371/27 |
| 4,716,564 | 12/1987 | Hung | 371/27 |

OTHER PUBLICATIONS

J. P. Roth, "Testing for Several Failures", IBM TDB, vol. 24, No. 7A, 12/1981, pp. 3259–3261.

Primary Examiner—Allen MacDonald
Assistant Examiner—Robert W. Beausoliel
Attorney, Agent, or Firm—Limbach, Limbach & Sutton

[57] ABSTRACT

In the present invention a method for generating tests for a combinational logic circuit of the PLA type is disclosed. The method is suited to generate tests to determine the input signals, the mid-term output signals of the AND gates, and the output signals, for stuck-at-0 and stuck-at-1 conditions.

9 Claims, 1 Drawing Sheet

METHOD OF GENERATING TESTS FOR A COMBINATIONAL LOGIC CIRCUIT

TECHNICAL FIELD

The present invention relates to a method of testing a combinational logic circuit, and more particularly, to a method of testing a combinational logic circuit having a first plurality of AND gates and a plurality of OR gates.

BACKGROUND OF THE INVENTION

Methods for generating tests for logic circuits to detect faults therein are well known in the art. Most of these prior methods use the so-called "stuck-at" fault model and are based on path-sensitization. See, for example, J.P. Roth "Diagnosis of Automated Failures: A Calculus and A Method", IBM Journal of Research and Development, No. 10, October 1966, pp. 278–281; P. Goel, "An Implicit Enumeration Algorithm to Generate Tests for Combinational Logic Circuits", IEEE Transactions on Computers, Vol. C-30, March 1981, pp. 215–222; and H. Fujiwara and T. Shimono, "On the Acceleration of Test Generation Algorithms", IEEE Transactions on Computers, Vol. C-32, December 1983, pp. 1137–1144.

In general, the three steps involved in a pathsensitization algorithm are:

1. Specification of inputs to generate the appropriate value at the site of the fault (0 for stuck-at-1 fault and 1 for a stuck-at-0 fault). This step is called fault sensitization.

2. Selection of a path from the fault site to an output and specification of additional signal values to propagate the fault along the path to the output. This step is called error propagation.

3. Specification of input values to produce the signal values specified in step 2. This step is called line justification.

See M.A. Breuer and A.D. Friedman, *Diagnosis and Reliable Design of Digital Systems*, Computer Science Press, 1976, p. 37.

The prior art methods are suitable for generating tests for general combinational logic circuits that are composed of arbitrary interconnection of logic circuits. As a result, the algorithms are complex and difficult to implement.

For certain types of applications, such as Programable Logic Arrays (PLA), where the logic circuits comprise an array of a first type of logic circuits interconnected with an array of a second type of logic circuits and have a well defined interconnection, the method for generating tests for the combinational logic circuits can be greatly simplified.

SUMMARY OF THE INVENTION

In the present invention a method for generating tests for a combinational logic circuit which has a plurality of logic circuits of one type and plurality of logic circuits of another type is disclosed. The combinational logic circuit has a plurality of inputs which are supplied to the plurality of logic circuits of one type as inputs thereto. The plurality of logic circuits of one type produce a plurality of first outputs which are supplied as inputs to the plurality of logic circuits of another type. The plurality of logic circuits of another type produce a plurality of outputs, which are the outputs of the combinational logic circuit. The method of the present invention generates tests for all of the inputs to the combinational logic circuit and comprises the steps of (a) selecting one of the inputs to the combinational logic circuit and setting the one selected input to a particular logic state; (b) a list of the logic circuits of the one type affected by the input selected is determined; (c) one of the logic circuits of the one type from the list determined of step (b) is then chosen; (d) the other inputs to the logic circuits of the one type chosen from (c) are then set to a logic state such that only the logic state of the one input chosen is propagated therethrough; (e) a list of the logic circuits of another type affected by the first output of the logic circuit of the one type chosen from (c) is then determined; (f) one of the logic circuits of another type affected by the first output is then chosen; (g) the other inputs to the logic circuit of another type which is chosen from (f) are set to a logic state such that only the logic state of the first output chosen is propagated therethrough; (h) another logic circuit of another type is chosen from the list of step (e), if step (g) results in conflicting logic states, and the method returns to step (g); (i) another logic circuit of one type from the list of step (b) is chosen if all of the logic circuits of another type of the list of step (e) results in conflicting logic states and the method returns to step (d); (j) finally, another input to the combinational logic circuit is chosen and is set to a particular logic state and the method returns to step (b).

DETAILED DESCRIPTION OF THE DRAWING

Figure 1:
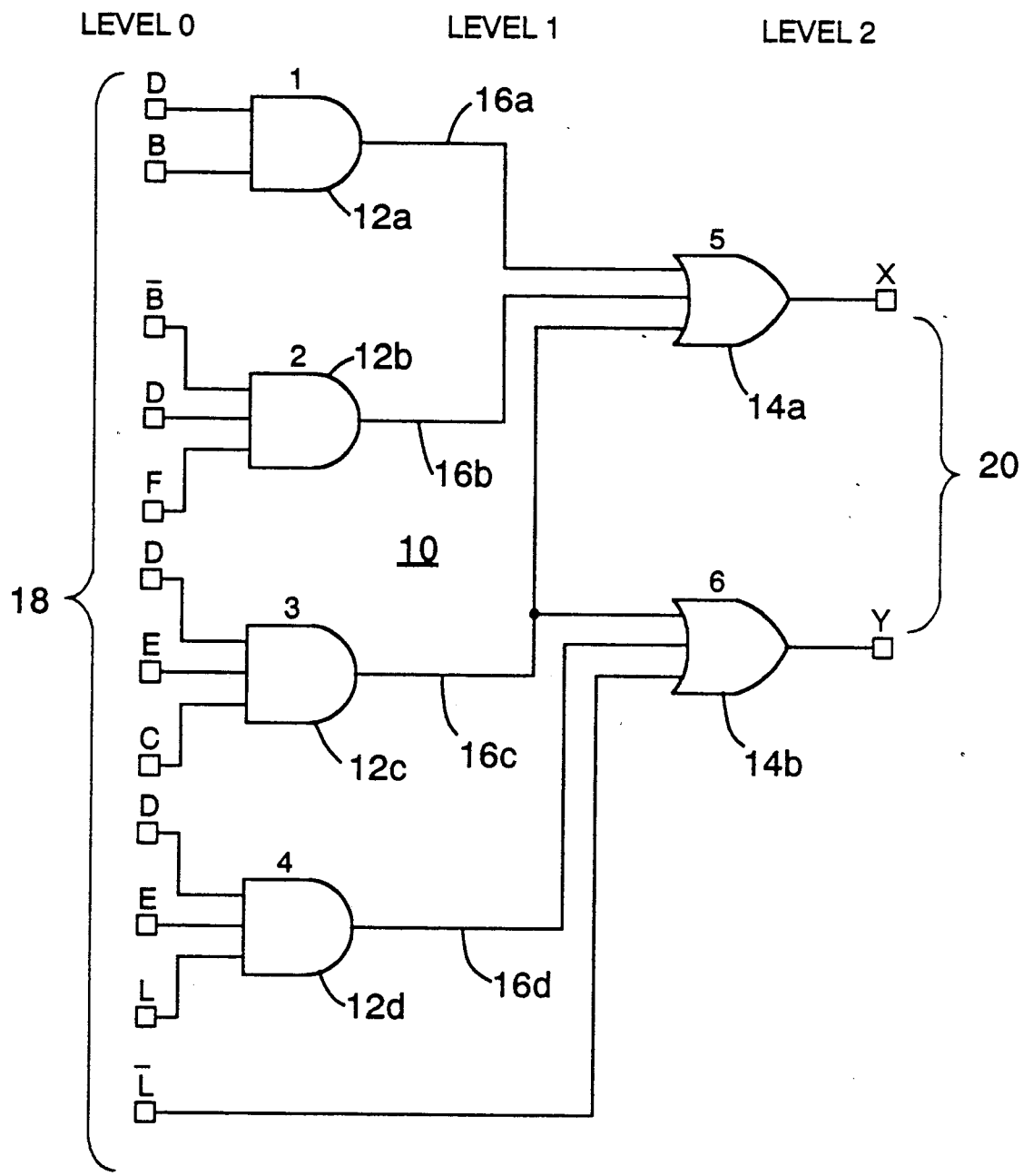
FIG. 1 is a schematic drawing of a type of circuit to which the method of the present invention is particularly adapted for generating tests.

The present invention relates to a method of generating tests for a combinational logic circuit having a plurality of logic circuits of one type and a plurality of logic circuits of another type. One example of such a type of logic circuit is a well known prior art combinational logic circuit called a PLA (Programmable Logic Array). A typical PLA circuit has a plurality of AND gates each of which may have a plurality of inputs thereto. The plurality of AND gates produce a plurality of outputs which are supplied to an array of OR gates. The input to the PLA device can be supplied directly to the input of the AND gates and/or to the input of the OR gates. The output of the OR gates is the output of the PLA device.

The PLA device is programmed by interconnecting the appropriate inputs to the PLA device to the appropriate inputs to the AND gates and/or to the inputs of the appropriate OR gates. In addition, the outputs of certain AND gates are connected to the inputs to certain of the OR gates. The programming of the PLA device can occur during the manufacturing of the device or it can also occur after the device is manufactured and the circuit is programmed in the field. In the latter, the PLA device is known as a FPLA (Field Programmable Logic Array). In either event, it is desireable to check the logic of the programing to insure that the intended signals propagate to the intended gates in the desired manner.

Referring to FIG. 1 there is shown an example of a programmed PLA device 10 which is suited for testing. The method of the present invention will be described with regard to the generation of tests for the programed PLA device 10 shown in FIG. 1. However, as previously discussed, the method of the present invention can be used with any other combinational logic circuits which have a plurality of logic circuits of one type and a plurality of logic circuits of another type and wherein the outputs of the logic circuits of the one type are interconnected in a particular manner with the inputs of the logic circuit of the other type. Once the tests are generated by the method of the present invention, the PLA device is then physically tested, by using the combination of signals determined by the method of the present invention.

The programmed PLA device 10 comprises four AND gates of 12 (A-D) and two OR gates 14 (A-B). The AND gate 12A has as its inputs thereto signals D and B. The AND gate 12B has as its inputs thereto $\overline{B}$, D and F. The AND gate 12C has as its inputs thereto D, E and G. The AND gate 12D has as its inputs D, E and L. The outputs of the AND gates 12A, 12B and 12C are supplied as inputs to the OR gate 14A. The outputs of the AND gate 12C and 12D and the input $\overline{L}$ are supplied as its inputs to the OR gate 14B. The output of the OR gates 14A and 14B (X and Y respectively), form the output 20 of the combinational logic circuit 10. The inputs 18 to the combinational logic circuit 10, thus comprises B, $\overline{B}$, D, E, F, G, L and $\overline{L}$. The signals B & $\overline{B}$ and the signals L & $\overline{L}$ must be complements of one another.

The method of the present invention divides the faults in the PLA device 10 into three classes: input faults (Level 0), AND-gate-output faults (Level 1) and output faults (Level 2). The procedures for generating tests for faults in each of these classes are described below.

The method begins by setting the input pin under test to the desired value, 1 for a stuck-at-0 fault and 0 for a stuck-at-1 fault. It then sensitizes a path through the PLA device 10 so that the logic value placed on the input can be viewed at a PLA output 16 or 20. This is done in two stages: the method propagates the logic value first to level 1 (the outputs of the AND gates) and then to level 2 (the outputs of the OR gates).

Since a given input pin can feed several AND gates 12 the method arbitrarily chooses one of these AND gates 12. All the inputs of the AND gate 12 except the one under test are then set to the value of "1". Hence, the logic value at the input pin under test determines the logic value at the AND gate output 16.

The logic value must now be propagated to the PLA outputs 20 through one of the OR gates 14. Since the AND gate 12 may feed several OR gates 14, the method arbitrarily chooses one of the OR gates 14. In order to propagate the fault effect through the OR gate 14, the method attempts to set the circuit inputs so that the outputs of all the AND gates 12 feeding the OR gate 14 except the one being used to propagate the fault effect are set to zero. As demonstrated in the following example, the process of setting a set of AND-gate outputs 16 to zero may involve some backtracking. If the PLA circuit 10 is redundant, then it may not be possible to do this and it may not be possible to generate a test for that particular node.

In this case, the algorithm chooses a different OR gate 14 and attempts to propagate the fault effect from level 1 to level 2 through this gate. If none of the OR gates 14 leading from the AND gate 12 to PLA outputs 20 can be used to propagate the fault effect, then the algorithm backs up and chooses a different AND gate 12 to go from level 0 to level 1. This backtracking procedure will succeed in generating a test if the fault is detectable.

There are three steps in the procedure where backtracking may occur: in choosing an AND gate 12 to go from level 0 to level 1, in choosing an OR gate 14 to go from level 1 to level 2 and in choosing a set of input assignments 18 that force the outputs 16 of a group of AND gates 12 to zero. If the PLA device 16 is not redundant, then any choice of an AND gate 12 and OR gate 14 for fault propagation will succeed and there will be no backtracking for these two choices.

A pattern generated to detect an input fault 18 will detect faults along the sensitized path from the fault location to the output where it is observed. The method will not generate additional test for these faults.

Specifically to test the fault of the input signals, the following procedure is used:

(1) One of the input 18 to the combinational logic circuit 10 is selected and is chosen to a particular logic state. Referring to FIG. 1, we shall assume that input D is first chosen.

(2) The next step is to determine a list of the AND gates 12 (A-D) to which the input signal D is supplied. In this case, the input signal D is supplied to AND logic gates 12A, 12B, 12C and 12D.

(3) One of the AND logic gates 12 (A-D) is chosen. We shall assume that AND logic gate 12A is first chosen.

(4) All the other input signals to the logic gate 12A chosen are set such that only the input signal D is propagated therethrough. Since the logic gate chosen 12A is AND gate, the other inputs (namely input signal B) is then chosen to be in the state of "1". With input signal B set to "1", input signal D can then propagate through the AND gate 12A. The output 16A is the output of the AND gate 12A chosen.

(5) The method then continues by determining a of the logic circuits of the other type, i.e., OR gate 14 (A-B) affected by the output signal 16A. In this case, output signal 16A affects only OR logic gate 14A.

(6) If more than one OR gate 14 (A-B) is affected by the output signal 16A then one of the OR gates is chosen.

(7) All the other inputs to the OR gate 14A chosen are then set to a logic level or state such that only the output signal 16A is propagated therethrough. Since the logic gate 14A is an OR gate, the inputs thereto, namely output signal 16B and output signal 16C must be set to a state of "0" such that the output signal 16A can then propagate through the OR gate 14A. Output signal 16B is "0" because $\overline{B}$ input of gate 12B is "0" and output signal 16C can be set to "0" by setting input E to "0".

(8) At this point, the method determines if there is any conflict in the logic states of the combinational logic array 10 by setting the output signals 16B and 16C to the state of "0". In this case, since there is not conflict, the program then tries to generate a test for another input.

As for testing the faults of the output signals of the AND gates 12 (A-D), the method begins by setting the chosen AND gate output 16 to a logic value needed to detect the fault. The fault effect is then propagated from the chosen output signal to the outputs 20 of the PLA 10, in the same way as for detection of faults of the input signals 18. A pattern which detects an AND gate output 16 fault will detect faults along the sensitized path from the fault to the output 20 where it is observed.

As an example, to test the output signal 16C, stuck-at-0, would begin with the following:

1. Set 16C equal to 1.

2. We can use either gate 14A or 14B to propagate the fault through the PLA 10. If we choose OR gate 14B, then output signal 16D and input $\overline{L}$ must both be 0. Since 16C equals 1, input signal D equals input signal E equals input signal G equals 1. Since input signals D and E are set, the only way output signal 16D can be "0" is if input signal L is equal to 0. However, if input signal L equals 0, input signal $\overline{L}$ equals "1" which means that OR gate 14B cannot be chosen.

3. Thus, gate 14A must be chosen. If gate 14A is chosen, 16A must equal zero. To drive 16A to "0", since D equals 1, B must equal zero. If B equals 0, then $\overline{B}$ must equal 1. Thus, to drive 16B to "0", F must equal 0.

Therefore, the input signals needed to test for AND gate output signal 16C stuck-at-0 must be D equals 1, E equals 1, G equals 1, B equals 0, and F equals zero. The expected response is output X equals 1.

Finally, to test the output faults X and Y, since these output signals 20 are boolean equations of the input signals 18, it is common to simply set the input signals 18 to their expected values and test the output values 20 based upon the boolean equation.

The method of the present invention can be utilized by running a computer program written in the Mainsail language running on an Apollo computer. A copy of the program to generate tests for the input faults is set forth in Exhibit 1, to generate tests for the AND gate output 16 faults is set forth in Exhibit 2, and an algorithm to determined the output of multiple AND gates and set them to zero and the affect thereof is shown in Exhibit 3.

What is claimed is:

1. A method of generating tests for a combinational logic circuit having a plurality of logic circuits of one type and a plurality of logic circuits of another type, said combinational logic circuit having a plurality of inputs which are supplied to said plurality of logic circuits of one type as input thereto, said plurality of logic circuits of one type producing a plurality of first outputs which are supplied to said plurality of logic circuits of another type as inputs thereto, said plurality of logic circuits of another type producing a plurality of outputs which are the outputs of said combinational logic circuit, said method comprising the steps of:
    (a) selecting one of said inputs to said combinational logic circuits and setting said one input to a logic state;
    (b) determining a list of the logic circuits of one type affected by the input selected by step (a);
    (c) choosing one of the logic circuits of one type from the list of step (b);
    (d) setting other inputs to the logic circuit of one type chosen in step (c), to a logic state such that only the logic state of the one input of step (a) is propagated therethrough;
    (e) determining a list of the logic circuits of another type affected by the first output of the logic circuit of one type from step (c);
    (f) choosing one of the logic circuits of another type from the list of step (e);
    (g) setting the other inputs to the logic circuit of another type chosen, to a logic state such that only the logic state of the first output of step (e) is propagated therethrough;
    (h) choosing another logic circuit of another type from the list of step (e), if step (g) results in conflicting logic states, and returning to step (g);
    (i) choosing another logic circuit of one type from the list of step (b), if all of the logic circuits of the another type on the list of step (e) results in conflicting logic states, and returning to step (d); and
    (j) choosing another input to said combinational logic circuit and setting said another input to a logic state and returning to step (b).

2. The method of claim 1 wherein said logic circuits of one type are AND gates and said logic circuits of another type are OR gates.

3. The method of claim 2 wherein said other inputs of step (d) are set to the logic state of "1" and said other inputs of step (g) are set to the logic state of "0".

4. The method of claim 1 further comprising the steps of:
    (k) selecting one of the plurality of first outputs;
    (l) setting said one output selected from step (k) to a logic state;
    (m) determining a list of the logic circuits of another type affected by the output selected from step (k);
    (n) choosing one of the logic circuits of another type from the list of step (m);
    (o) setting all other inputs to the logic circuit of another type chosen to a logic state such that only the logic state of the first output of step (l) is propagated therethrough;
    (p) choosing another logic circuit of another type from the list of step (m), if step (o) results in conflicting logic states and returning to step (o); and
    (q) choosing another of the plurality of first outputs and returning to step (l).

5. The method of claim 4 wherein said logic circuits of one type are AND gates and said logic circuits of another type are OR gates.

6. The method of claim 5 wherein said other inputs of step (d) are set to the logic state of "1" and said other inputs of step (g) are set to the logic state of "0".

7. The method of claim 4 further comprising the steps of:
    (r) setting the selected inputs to said combinational logic circuit to selected logic states that affect an output of said combinational logic circuit in accordance with the boolean logic equation between said output and said selected inputs.

8. The method of claim 7 wherein said logic circuits of one type are AND gates and said logic circuits of another type are OR gates.

9. The method of claims 8 wherein said other inputs of step (d) are set to the logic state of "1" and said other inputs of step (g) are set to the logic state of "0".

* * * * *